United States Patent
Rotchford et al.

(10) Patent No.: US 7,443,323 B2
(45) Date of Patent: Oct. 28, 2008

(54) CALIBRATING A DIGITAL-TO-ANALOG CONVERTER

(75) Inventors: Christian J. Rotchford, Austin, TX (US); Brandt Braswell, Chandler, AZ (US); Jiangbo Gan, Gilbert, AZ (US); Michael L. Gomez, Tempe, AZ (US); Gerald P. Miaille, Chandler, AZ (US); Boris V. Razmyslovitch, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/651,858

(22) Filed: Jan. 10, 2007

(65) Prior Publication Data

US 2008/0165040 A1 Jul. 10, 2008

(51) Int. Cl.
*H03M 1/10* (2006.01)

(52) U.S. Cl. .................. 341/120; 341/118; 341/144; 341/145

(58) Field of Classification Search ........... 341/118, 341/120, 143–145
See application file for complete search history.

(56) References Cited

U.S. PATENT DOCUMENTS

| | | | |
|---|---|---|---|
| 4,903,024 A | | 2/1990 | Evans et al. |
| 5,153,592 A | * | 10/1992 | Fairchild et al. ........... 341/118 |
| 5,451,946 A | * | 9/1995 | Smith et al. ............... 341/118 |
| 5,666,118 A | * | 9/1997 | Gersbach ................... 341/120 |
| 5,955,979 A | * | 9/1999 | Knudsen .................... 341/118 |
| 6,005,419 A | * | 12/1999 | Rudish ....................... 327/107 |
| 6,624,772 B1 | | 9/2003 | Gealow et al. |
| 6,897,794 B2 | * | 5/2005 | Kuyel et al. ................ 341/120 |
| 6,956,512 B1 | * | 10/2005 | San et al. .................... 341/120 |
| 2006/0092062 A1 | | 5/2006 | Pan |

OTHER PUBLICATIONS

A.C.Dent and C.F.N. Cowan; Improving DAC Linearity by Threshold Tracking; IEEE, 1989.
Ken Gentile & Roger Huntley, Signal Cancellation Inproves DDS SFDR, Microwaves & RF, Aug. 2006.
Baker. Get more accuracy from your DAC. EDN Magazine [online], Oct. 26, 2006, p. 38, [retrieved on Apr. 10, 2008] Retrieved from the Internet: <URL: http://edn.com/contents/images/6382644.pdf>, entire document.
International Searching Authority and Written Opinion on International application No. PCT/US 07/88106 dated Apr. 30, 2008.

* cited by examiner

*Primary Examiner*—Khai M Nguyen
(74) *Attorney, Agent, or Firm*—Charles W. Bethards

(57) ABSTRACT

Methods and corresponding systems for calibrating a digital-to-analog converter include selecting first and second code regions in the digital-to-analog converter, wherein the first and second code regions are separated by a boundary. Thereafter a waveform sequence is input into the digital-to-analog converter, wherein the waveform sequence has a zero offset at the boundary. Then a relative compensation value between the first and second code regions is adjusted to reduce a distortion in an output of the digital-to-analog converter. A magnitude of a third harmonic distortion of the waveform sequence can be used to measure distortion in the output. Adjusting the relative compensation can include converting the output of the digital-to-analog converter to a digital sequence, filtering the digital sequence, and measuring a harmonic distortion in the digital sequence.

22 Claims, 2 Drawing Sheets

CALIBRATING A DIGITAL-TO-ANALOG CONVERTER

BACKGROUND

1. Field

This disclosure relates generally to digital-to-analog converters (DACs), and more specifically, to techniques and apparatus for calibrating digital-to-analog converter circuits.

2. Related Art

A digital-to-analog converter (DAC) is a device for converting a digital (usually binary) code to an analog signal such as a current, voltage or an electric charge. DACs are widely used components of various electronic systems, such as telephone and other communications systems, radio transceiver systems, audio systems, image processing systems, and the like.

Many DACs are fabricated in an integrated circuit, where variations in semiconductor manufacturing processes can affect the performance of the DAC. For example, over the entire range of digital codes that can be input into the DAC, a step from one code to the next code in one portion or region of the input codes can produce a different output step size in the analog signal due to nonlinearities introduced in the manufacturing process, or due to differences in circuit architecture used to produce an output signal in one code region compared to another. Some DACs may use some circuits to output a signal with a smaller amplitude, and may use other circuits to output signals with larger amplitudes.

Because nonlinearities or other anomolies can be present in DACs, and because such issues can cause problems in the application and use of the analog outputs signals, there is a need for calibration systems and techniques that can improve upon the accuracy and linearity of the output signals of the DAC.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
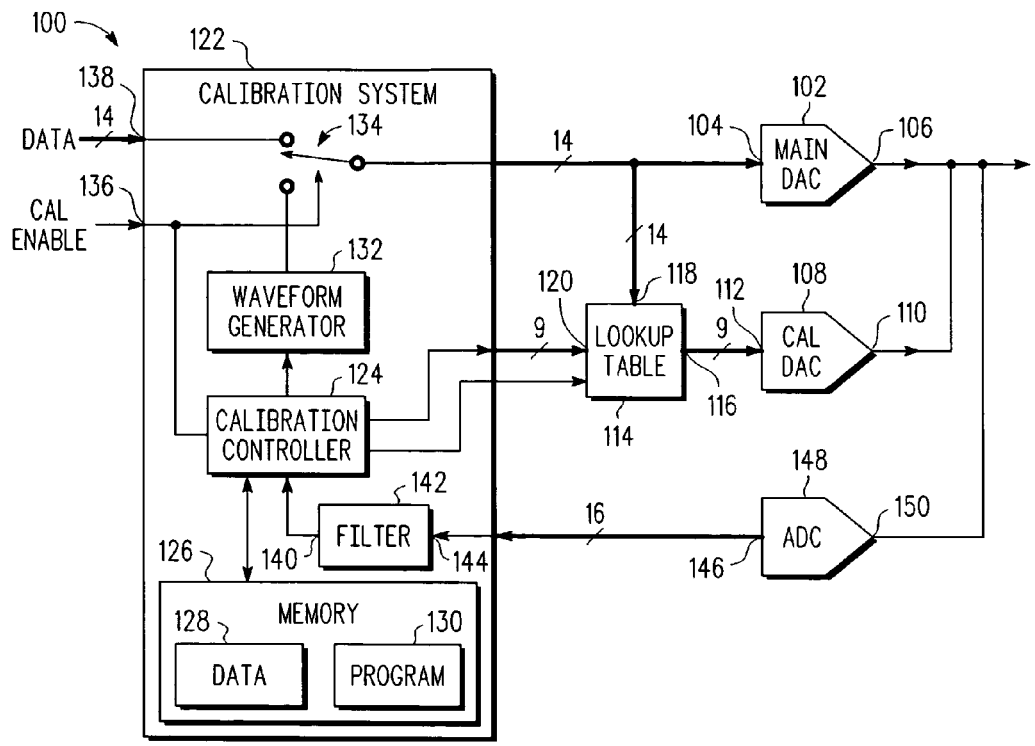
FIG. 1 is a high-level block diagram of a digital-to-analog converter having a calibration system in accordance with one or more embodiments.

Referring to FIG. 1, a high-level diagram of portions of a digital-to-analog converter (DAC) having a calibration system in accordance with one or more embodiments will be briefly discussed and described. As shown, digital-to-analog converter 100 includes main DAC 102, which receives a digital value or digital code at DAC input 104, and outputs an analog signal (e.g., a current, a voltage, or an electric charge) at DAC output 106 in response to the digital code at the input. Main DAC 102 is the primary digital-to-analog converter.

CAL DAC (calibration digital-to-analog converter) 108 is a secondary or auxiliary DAC that provides an output signal at CAL DAC output 110 that can be used to correct, adjust, or calibrate the output of main DAC 102 in response to a digital value or digital code at CAL DAC input 112. Thus, CAL DAC output 110 is coupled to DAC output 106 so that it can adjust the DAC output 106 to compensate for errors, including any nonlinearities in step size, in the operation of main DAC 102.

CAL DAC input 112 is coupled to look up table 114. Look up table 114 outputs a compensation value (e.g., a digital code) at look up table output 116. The compensation value is selected by the digital code received at look up table input 118, which can be the same digital code that is input into DAC input 104. Thus, the value at look up table input 118 acts as an index (i.e., a value corresponding to an address of a memory location in the lookup table that contains a corresponding value) pointing to a compensation value, which is recalled and output at look up table output 116.

As illustrated in the embodiment of FIG. 1, DAC input 104 and look up table input 118 receive a digital code having 14 bits. Look up table output 112 outputs a compensation value having 9 bits. This means that there can be 512 compensation values stored in 16 locations in look up table 114, which corresponds to one compensation value for every group of 1024 14-bit input codes. These groups of input codes can be referred to as code regions.

Look up table 114 can also receive compensation values for storing in look up table memory from calibration input 120. Calibration input 120 is coupled to calibration system 122. Calibration system 122 calibrates DAC 100 (wherein the output of DAC 100 is the combined outputs of main DAC 102 and CAL DAC 108) by selectively providing a waveform sequence of digital codes to DAC input 104 and analyzing the output of main DAC 102 as it is adjusted by the output of CAL DAC 108, and determining calibration values that will be stored in lookup table 114 for use in normal operation of DAC 100.

Calibration system 122 can be implemented together with the main DAC 102 and CAL DAC 108 or as a separate system or integrated circuit. The calibration performed by the calibration system 122 could be performed during the manufacturing process for the DAC or upon system initialization, etc. Calibration system 122 in various embodiments includes a calibration controller 124 for performing and controlling the calibration process. Calibration controller 124 can be implemented using hardware, or software, or combination of both. Calibration controller 124 can be a separate processing system, or it can be a function or a functional module implemented as part of a larger system or control module. Calibration controller 124 can execute steps and control processes that provide signals and take measurements that are needed to calibrate DAC 100.

Calibration controller 124 can be coupled to memory 126, which provides storage for data 128 and program code 130 (e.g., software, microcode, firmware, or the like) that is used in the process of calibrating DAC 100.

Calibration controller 124 can also be coupled to and configured to control waveform generator 132. Various approaches for providing waveform generators are generally known in the art. For example, in one embodiment, a pre-calculated waveform sequence can be repeatedly recalled from memory. In another embodiment, the waveform sequence can be mathematically produced. In the particular embodiment, waveform generator 132 can be used for outputting a waveform sequence having a particular zero offset and peak amplitude. In one embodiment, the waveform is a periodic sequence of digital codes that represents a sine wave.

The zero offset of the waveform can be defined as the average value of the waveform. The peak amplitude of the waveform can be defined as the highest value above the zero offset.

The output of waveform generator 132 can be selectively coupled to DAC input 104 by switch 134, which can be switched by calibration enable signal 136. When calibration enable signal 136 is active, switch 134 switches from data input 138 to the output of waveform generator 132 to prepare for calibration. Calibration enable signal 136 can also be coupled to calibration controller 124 for controlling or initiating the calibration process. Calibration of the DAC can be initiated on an as needed basis (e.g., upon power up, or periodically, or from time to time) by a control function within the equipment using DAC 100.

Calibration controller 124 can also receive feedback data from filter output 140 of filter 142. Filter input 144 of filter 142 can be coupled to ADC (analog-to-digital converter) output 146 of ADC 148 for receiving digital codes or values that represent the output of the combination of main DAC 102 and CAL DAC 108. ADC input 150 is coupled to the combined outputs of main DAC 102 (i.e., main DAC output 106) and CAL DAC 108 (i.e., CAL DAC output 110). In the illustrated embodiment, ADC output 146 includes sixteen bits of digital information that represents the analog signal input at ADC input 150. As shown in FIG. 1, ADC output 146 can include sixteen bits of digital information that represents the analog signal input at ADC input 150. This sixteen-bit resolution exceeds the fourteen bits of information input into main DAC 102. This increased resolution allows more precise measurement of the output of DAC 100 such that the CAL DAC performance can be measured by the ADC.

In one embodiment, filter 142 can be implemented with a filter that passes a harmonic of the waveform sequence output by waveform generator 132. More particularly, filter 142 can be a digital filter that measures the amplitude of a third harmonic of a waveform sequence from waveform generator 132. Filter 142 can be implemented using digital signal processing techniques and algorithms for filtering and analyzing spectral components of a waveform. Such techniques can include fast Fourier transform (FFT) signal processing techniques, which can be used to selectively isolate signal levels of harmonic components of an input signal.

Figure 2:
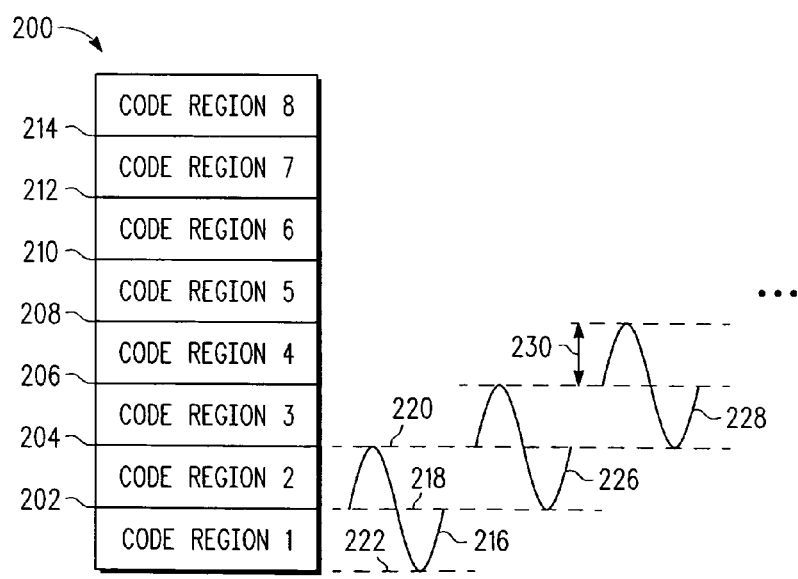
FIG. 2 is a schematic representation of code regions of a digital-to-analog converter along with representations of various waveform sequences that can be used by the calibration system of FIG. 1 in accordance with one or more embodiments.

Referring to FIG. 2, there is depicted a schematic representation of code regions of a DAC, such as DAC 102 in FIG. 1, in accordance with one or more embodiments. A DAC is designed to receive a range of digital codes (e.g., such as binary values "0000, 0001, . . . 1110, 1111") that will be converted into an analog signal. The entire range of digital codes that can be input into main DAC 102 is represented by 200. For example, if 14 digital bits of information comprise the digital input code, the input range is from 0 to 16,383 (represented as fourteen-bit binary numbers).

For the purpose of more accurately calibrating the output of main DAC 102 a plurality of calibration values can be assigned or mapped to a plurality of code regions (e.g., a plurality of ranges of code values selected from the entire range of digital code input values). As shown in FIG. 2, the entire range of digital input codes 200 has been separated or divided into, for example, 8 code regions, which are shown by "code region 1" through "code region 8." If the range of 16,384 input codes (e.g., a fourteen-bit input code) is divided into eight equally spaced regions, each region would include 2048 input codes. Regions do not need to be equally spaced, and different sized regions can be used if appropriate, e.g., if finer accuracy is desired in a particular area of the DAC range.

FIG. 2 shows that code regions 1 through 8 are separated by code boundaries, which are represented at 202, 204, 206, 208, 210, 212, and 214. Thus, for eight code regions there are seven code boundaries, wherein each code boundary separates two adjacent code regions.

FIG. 2 also shows graphical representations of waveform sequences (e.g., provided by waveform generator 132) that can be used in calibrating DAC 100. In one embodiment, such waveform sequences represent sine waves having selected zero offsets and amplitudes. For example, one waveform sequence used during calibration can be a sequence of digital codes selected to produce sine wave 216, which has a zero offset 218 located at boundary 202 between code region 1 and code region 2. The waveform sequence represented by sine wave 216 is comprised of digital codes having a range from the higher value shown at 220 to the lower value at 222.

The waveform sequence associated with sine wave 216 can be used to determine relative compensation values associated with boundary 202 between code region 1 and code region 2. The relative compensation value indicates a difference between the compensation values of adjacent code regions, which code regions can be referred to as a first code region and a second code region that are separated by a boundary. Additional waveform sequences can be used to determine relative compensation values associated with other code regions. For example, waveform sequences associated with sign waves 226 and 228 can be used to determine relative compensation values associated with code region boundary 204 and code region boundary 206, respectively.

Figure 3:
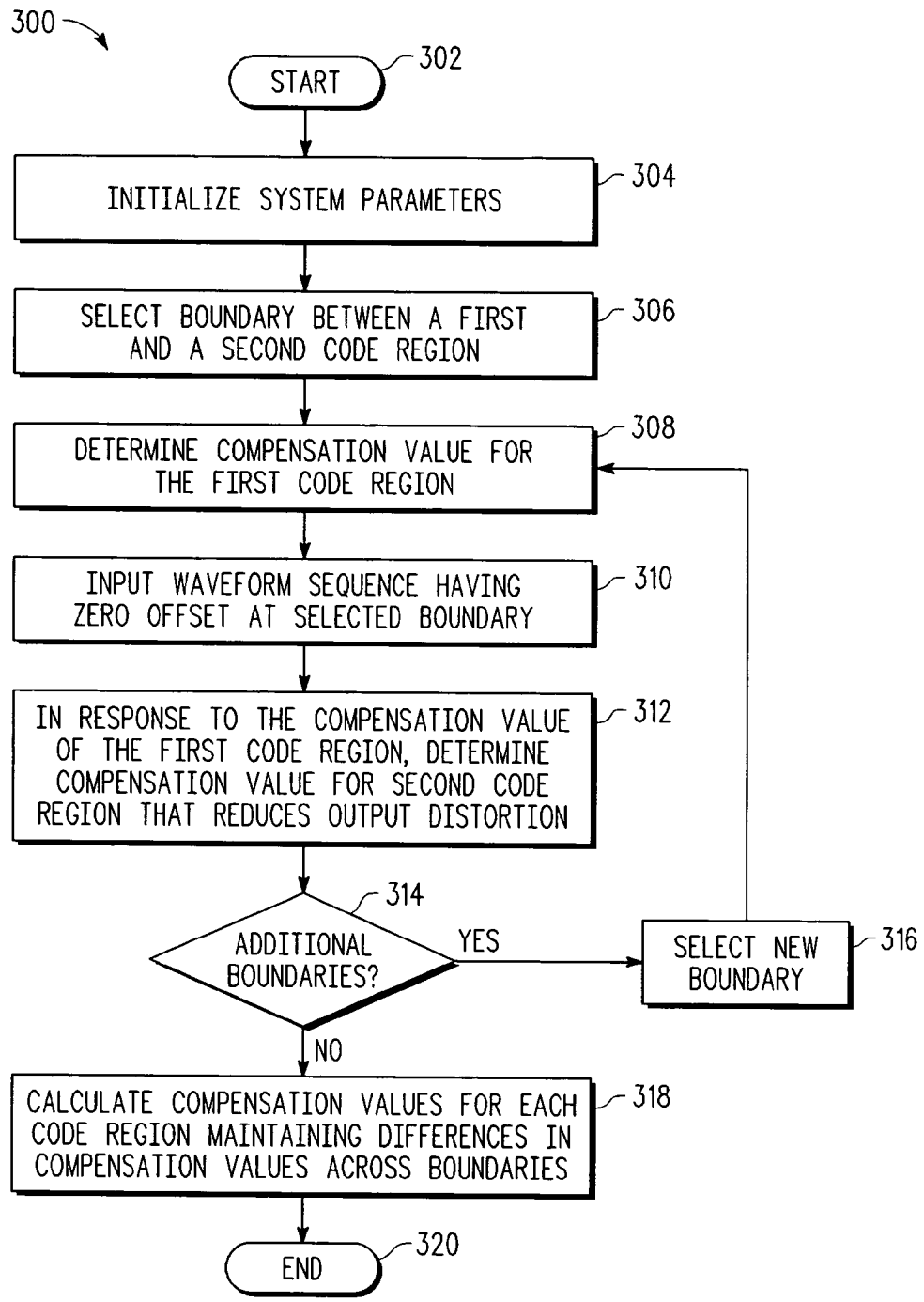
FIG. 3 is a flowchart of a process of calibrating a digital-to-analog converter in accordance with one or more embodiments.

Referring to FIG. 3, there is depicted a high-level flowchart of processes that can be executed by DAC 100 for calibrating the DAC in accordance with the one or more embodiments. As shown, process 300 begins at 302, and thereafter passes to 304 wherein the process initializes system parameters. System parameters that can be initialized include: e.g., setting the DAC resolution, determining the number of code regions and corresponding boundaries, initializing counters, and the like. In the embodiment shown in FIG. 1, DAC 100 has a fourteen bit resolution. In one embodiment, sixteen code regions can be used in DAC 100. Other embodiments can use a different number of code regions, such as, for example, the eight code regions that are shown in FIG. 2.

Next, the process selects a boundary between a first and a second code region, as shown at 306. In one embodiment, the first and second code regions can be any two of the plurality of code regions that are adjacent and separated by a single boundary. For example, in FIG. 2, code regions 1 and 2 can be initially selected as the first and second code regions, wherein boundary 202 separates the two selected regions.

After selecting the boundary between the first and second code regions, the process determines a compensation value for the first code region, as illustrated at 308. In a first pass through the flowchart, the first code region can be assumed to have a compensation value of zero. In a second and subsequent passes through the flowchart, the first code region can be set to have a compensation value determined in a previous pass.

Next, the process inputs a waveform sequence having a zero offset at the selected boundary (i.e., the waveform has an average or DC value substantially equal to the value corresponding to the selected boundary), as shown at 310. The waveform sequence can be a sequence of digital codes that represent a periodic waveform having a zero offset at a digital code substantially equal to a code closest to the selected boundary. The zero offset can be substantially equal to an average value of the waveform sequence averaged over one or more periods of the waveform sequence. In one embodiment, the waveform sequence can represent a sine wave, such as sine wave 216 in FIG. 2, which has a zero offset 218 at boundary 202. Other embodiments can use other periodic waveforms that have a fundamental frequency.

In one embodiment, the peak amplitude of the waveform sequence (see 230 in FIG. 2) is substantially equal to a range of values in the smaller of the selected first or second code regions. Thus, the waveform sequence includes code values that remain within the values encompassed by the selected first and second code regions, which means that, in one embodiment, the waveform sequence crosses only one boundary, remaining between the two boundaries on either side of the selected boundary. For example, if the selected boundary is 204, the waveform sequence 226 remains within boundaries 202 and 206.

After inputting the waveform sequence and the compensation value for the first code region, the process determines a compensation value for the second code region that reduces the output distortion of the DAC, as depicted at 312. To minimize the output distortion, the process can vary or adjust the compensation value of the second code region (e.g., the corresponding compensation value stored in look up table 114) relative to the first code region and search for a minimum level of output distortion. Calibration controller 124 can write various compensation values into memory locations corresponding to code regions in look up table 114 by writing data to calibration input 120. In one embodiment, the search for a minimum level of output distortion can use a sweep of a range of compensation values that are temporarily stored in look up table 114, wherein following the sweep a compensation value corresponding to a minimum distortion is selected. In other embodiments, another suitable algorithm can be used, such as a least mean square (LMS) search algorithm. Note that at 312 the process determines a relative compensation value (e.g., a difference in the compensation values) between the first and second code regions. The compensation value for a code region (e.g., the second code region) is not determined independently of the value of another code region (e.g., the first code region). The distortion in the output is a function of the difference in the compensation values of code regions on either side of the boundary.

In one embodiment, the output distortion reduced at 312 is a magnitude of a third harmonic of the waveform sequence input at 310. In other embodiments, other distortion metrics can be measured and minimized. For example, some embodiments may examine a second harmonic of the input waveform sequence.

In one embodiment, the output distortion is measured by converting the output signal (e.g., DAC output 106) back to a digital signal using ADC 148. ADC output 146 can then be filtered by filter 142 in order to isolate any distortion in the signal. In one embodiment, filter 142 can include an FFT, which can efficiently separate the output signal into its frequency components for further analysis. For example, a magnitude of a third harmonic can be determined from the output of such an FFT.

After finding the compensation value for the second code region (and finding the relative compensation value between the first and second code regions), the process determines whether there are additional boundaries to be analyzed, as illustrated at 314. For example, in a first pass through the adjustments at 312 a relative compensation between code region 1 and code region 2 is determined using a waveform sequence having a zero offset at boundary 202. At 314, the process determines whether code regions on either side of all boundaries 202, 204, 206, 208, 210, 212, and 214 have been analyzed. If there are additional code boundaries that have not been analyzed, the process selects a new code boundary, as shown at 316, and iteratively returns to 308 to set a compensation value for the first code region and input a new waveform sequence having a zero offset at the newly selected boundary. If the second pass selects boundary 204, the first code region can be code region 2, and the compensation value for the first code region (e.g., now set to code region 2) can be set to the value previously determined in the first pass at 312.

If all boundaries have been analyzed, the process calculates compensation values for each code region, wherein the compensation values maintain the differences or relative compensation values across each boundary, where such relative compensation values were determined at 312 for each boundary. For example, in one embodiment, code region 1 may have a compensation value of "0" and code region 2 may have a compensation value of "4," which makes the relative compensation value between these two regions equal to "4." In an analysis (312) at boundary 204 it may be determined that the relative compensation value is "6". In this case, the compensation value of code region 3 can be set to "10," which is a value calculated (e.g. 4+6) to maintain the relative compensation values across boundaries 202 and 204. The compensation values stored in look up table 114 for each code region will include a base value, e.g., a DC compensation value or the like, with the relative compensation values added thereto. For instance, if the base value is 100, in this example, respective regions 1-3 would have compensation values of 100, 104, 110 stored in the look up table.

The process illustrated in FIG. 3 can be implemented in the DAC of FIG. 1 or other suitably configured DAC systems with appropriate capabilities. The process can be repeated as needed or desired.

Although the invention is described herein with reference to specific embodiments, various modifications and changes can be made without departing from the scope of the present invention as set forth in the claims below. For example, while the techniques and apparatus for calibrating a DAC may vary widely, one or more embodiments can be used in a wireless communications system having a digital baseband signal processor and an analog transmitter. The inventive concepts and principles taught herein can also be applied to other wireline or wireless communications systems, and other systems that process digital and analog signals. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for calibrating a digital-to-analog converter, the method comprising:
    selecting first and second code regions in the digital-to-analog converter, wherein the first and second code regions are separated by a boundary;
    inputting a waveform sequence into the digital-to-analog converter, wherein the waveform sequence has a zero offset at the boundary; and
    adjusting a relative compensation value between the first and second code regions to reduce a distortion in an output of the digital-to-analog converter.

2. The method for calibrating a digital-to-analog converter according to claim 1 wherein the inputting the waveform sequence comprises inputting a sine wave sequence.

3. The method for calibrating a digital-to-analog converter according to claim 1 wherein the inputting the waveform sequence comprises inputting a waveform sequence having an amplitude substantially equal to a range of values in the first and second code regions.

4. The method for calibrating a digital-to-analog converter according to claim 1 wherein the adjusting the relative compensation value comprises adjusting a compensation value for the second code region relative to a compensation value for the first code region.

5. The method for calibrating a digital-to-analog converter according to claim 1 wherein the adjusting the relative compensation value between the first and second code regions to reduce the distortion in the output of the digital-to-analog converter comprises adjusting the relative compensation value between the first and second code regions to reduce a third harmonic distortion in the output of the digital-to-analog converter.

6. The method for calibrating a digital-to-analog converter according to claim 1 wherein the adjusting the relative compensation value between the first and second code regions to reduce the distortion in the output of the digital-to-analog converter comprises:
   converting the output of the digital-to-analog converter to a digital sequence;
   measuring a harmonic distortion in the digital sequence; and
   adjusting the relative compensation value between the first and second code regions to reduce a third harmonic distortion in the output of the digital-to-analog converter.

7. The method for calibrating a digital-to-analog converter according to claim 1 further comprising repeating the selecting, inputting, and adjusting steps for each boundary between code regions of the digital-to-analog converter to determine a relative compensation value for each boundary.

8. The method for calibrating a digital-to-analog converter according to claim 7 further comprising calculating compensation values for each code region while maintaining the relative compensation values of each boundary between code regions.

9. The method for calibrating a digital-to-analog converter according to claim 1 further comprising repeating the selecting, inputting, and adjusting steps for an additional boundary between additional code regions of the digital-to-analog converter to determine an additional relative compensation value for the additional boundary.

10. The method for calibrating a digital-to-analog converter according to claim 1 further comprising calculating compensation values for a plurality of code regions while maintaining relative compensation values across boundaries between the plurality of code regions and storing the compensation values for use in the calibrating the digital-to-analog converter.

11. A system for calibrating a digital-to-analog converter comprising:
   a main digital-to-analog converter (DAC) having a DAC input and a DAC output;
   a calibration digital-to-analog converter (CALDAC) having a CALDAC output coupled to the DAC output for adjusting the DAC output, and having a CALDAC input;
   a lookup table for storing and outputting calibration values, wherein the lookup table has a lookup table input coupled to the DAC input and a lookup table output coupled to the CALDAC input;
   an analog-to-digital converter (ADC) having an ADC output, and an ADC input coupled to the DAC output;
   a waveform generator having a waveform sequence output selectively coupled to the DAC input for providing a waveform sequence to the DAC input and the lookup table input;
   a filter having a filter input coupled to the ADC output, and having a filter output; and
   a calibration controller coupled to the waveform generator, the lookup table, and the filter output, wherein the controller is adapted to determine calibration values in the lookup table in response to the waveform sequence and the filter output.

12. The system for calibrating a digital-to-analog converter according to claim 11 wherein the waveform sequence comprises a sine wave waveform sequence.

13. The system for calibrating a digital-to-analog converter according to claim 11 wherein the filter comprises a filter for passing a harmonic of the waveform sequence.

14. The system for calibrating a digital-to-analog converter according to claim 11 wherein the calibration values are associated with a plurality of code regions of the DAC, and wherein the waveform sequence is set to have a zero offset corresponding to a selected boundary between adjacent code regions.

15. The system for calibrating a digital-to-analog converter according to claim 14 wherein the waveform sequence is set to have a peak amplitude substantially equal to a range of codes in a code region.

16. The system for calibrating a digital-to-analog converter according to claim 11 wherein the filter comprises a digital filter that determines a magnitude of a third harmonic of the waveform sequence.

17. A digital-to-analog converter including calibration comprising:
   a main digital-to-analog converter (DAC) having a DAC input and a DAC output;
   a calibration digital-to-analog converter (CAL DAC) having a CAL DAC output coupled to the DAC output for adjusting the DAC output, and having a CAL DAC input;
   a lookup table for storing and outputting calibration values, wherein the lockup table has a lockup table input coupled to the DAC input and a lookup table output coupled to the CAL DAC input; and
   a calibration system for dynamically inputting a waveform sequence into the DAC input and determining the calibration values in response to a distortion at the DAC output corresponding to the waveform sequence, the calibration system further comprising a filter having a filter input coupled to the DAC output, wherein the filter is adapted to pass the distortion at the DAC output corresponding to the waveform sequence.

18. The digital-to-analog converter according to claim 17 wherein the calibration system further comprises:
   a waveform generator having a waveform sequence output selectively coupled to the DAC input and the lookup table input for providing a waveform sequence to the DAC input and the lockup table input.

19. The digital-to-analog converter according to claim 18 wherein the waveform generator comprises a sine wave generator.

20. The digital-to-analog converter according to claim 17 wherein the filter comprises a filter for passing a harmonic or the waveform sequence.

21. The digital-to-analog converter according to claim 18 wherein the calibration values are associated with a plurality of code regions of the DAC, and wherein the waveform sequence is set to have a zero offset corresponding to a selected boundary between adjacent code regions.

22. The digital-to-analog converter according to claim 18 wherein the waveform sequence is set to have a peak amplitude substantially equal to a range of codes in a code region.

* * * * *